United States Patent
Hammer et al.

(10) Patent No.: US 10,987,760 B2
(45) Date of Patent: Apr. 27, 2021

(54) METHOD OF MANUFACTURING A HOLDING PLATE, IN PARTICULAR FOR A CLAMP FOR HOLDING WAFERS

(71) Applicant: Berliner Glas KGaA Herbert Kubatz GmbH & Co., Berlin (DE)

(72) Inventors: Ralf Hammer, Freiberg (DE); Stefan Hoescheler, Berlin (DE); Mike Fischer, Berlin (DE); Gregor Hasper, Berlin (DE)

(73) Assignee: BERLINER GLAS KGAA HERBERT KUBATZ GMBH & CO., Berlin (DE)

( * ) Notice: Subject to any disclaimer, the term of this patent is extended or adjusted under 35 U.S.C. 154(b) by 261 days.

(21) Appl. No.: 15/164,435

(22) Filed: May 25, 2016

(65) Prior Publication Data

US 2016/0354864 A1 Dec. 8, 2016

(30) Foreign Application Priority Data

Jun. 3, 2015 (DE) .......................... 102015007216.1

(51) Int. Cl.
*B23K 26/352* (2014.01)
*B23K 26/00* (2014.01)
(Continued)

(52) U.S. Cl.
CPC ........ *B23K 26/355* (2018.08); *B23K 26/0006* (2013.01); *B23K 26/0622* (2015.10);
(Continued)

(58) Field of Classification Search
CPC .......................... B23K 26/0884; B23K 26/352
(Continued)

(56) References Cited

U.S. PATENT DOCUMENTS

| 6,271,579 B1 * | 8/2001 | Going | ............... H01L 21/67121 |
| | | | 257/664 |
| 7,579,654 B2 * | 8/2009 | Couillard | ............... H01L 21/268 |
| | | | 257/347 |

(Continued)

FOREIGN PATENT DOCUMENTS

| DE | 4119254 A1 | 12/1992 |
| DE | 4119878 A1 | 12/1992 |

(Continued)

OTHER PUBLICATIONS

Lasered Substrate Chamfering and Beveling, Valley Design Corporation, https://web.archive.org/web/20140315160840/http://www.valleydesign.com/laser-drilling.htm, Published Mar. 15, 2014 (Year: 2014).*

(Continued)

*Primary Examiner* — Jacob T Minskey
*Assistant Examiner* — Russell E Sparks
(74) *Attorney, Agent, or Firm* — Caesar Rivise, PC

(57) ABSTRACT

Method of manufacturing holding plate (11) including ceramic material of several chemical elements and configured for holding apparatus (10) for holding a component by electrostatic forces or vacuum, includes the steps of material removal from holding plate (11) by laser ablation, wherein by laser irradiation (1) protrusions (13) are formed on holding plate (11), end faces (13.1) of which span a carrier surface for the component, and surface modification of holding plate (11) by laser irradiation (1), wherein irradiation parameters of laser irradiation (1) are set such that at least one of the chemical elements of the ceramic material is enriched on the surface of holding plate (11). A method is also described of manufacturing holding apparatus (10) for holding a component by electrostatic forces or vacuum, holding plate (11) which is produced with the inventive (Continued)

method, and holding apparatus (10) with at least one holding plate (11).

17 Claims, 3 Drawing Sheets

(51) Int. Cl.

| | | |
|---|---|---|
| *H01L 21/683* | (2006.01) | |
| *B23K 26/361* | (2014.01) | |
| *B23K 103/00* | (2006.01) | |
| *B23K 26/08* | (2014.01) | |
| *B23K 26/0622* | (2014.01) | |
| *B23K 37/02* | (2006.01) | |
| *B23K 26/402* | (2014.01) | |

(52) U.S. Cl.
CPC ........ *B23K 26/0884* (2013.01); *B23K 26/352* (2015.10); *B23K 26/361* (2015.10); *B23K 26/402* (2013.01); *B23K 37/0235* (2013.01); *H01L 21/6833* (2013.01); *H01L 21/6838* (2013.01); *B23K 2103/52* (2018.08)

(58) Field of Classification Search
USPC .......................................... 264/400
See application file for complete search history.

(56) References Cited

U.S. PATENT DOCUMENTS

| | | | | |
|---|---|---|---|---|
| 7,680,557 | B2* | 3/2010 | Kim ................. | G05B 19/41865 |
| | | | | 700/121 |
| 9,101,038 | B2* | 8/2015 | Singh ................. | H01L 21/6833 |
| 10,020,218 | B2* | 7/2018 | Boyd, Jr. ............ | H01L 21/6875 |
| 2002/0142619 | A1* | 10/2002 | Grabbe ................. | C09K 13/08 |
| | | | | 438/753 |
| 2004/0145751 | A1* | 7/2004 | Binnard ................. | G03F 7/707 |
| | | | | 356/500 |
| 2010/0029058 | A1* | 2/2010 | Shimomura ...... | H01L 21/02675 |
| | | | | 438/458 |
| 2012/0147353 | A1* | 6/2012 | Lafarre ............... | G03F 7/70341 |
| | | | | 355/72 |
| 2013/0189802 | A1* | 7/2013 | Tromp .................... | G03F 7/707 |
| | | | | 438/14 |
| 2014/0159325 | A1 | 6/2014 | Parkhe et al. | |
| 2014/0175067 | A1* | 6/2014 | Reichenbach ......... | B23K 26/40 |
| | | | | 219/121.61 |
| 2014/0300064 | A1* | 10/2014 | Inaba ..................... | B23K 15/00 |
| | | | | 279/128 |

FOREIGN PATENT DOCUMENTS

| | | | | |
|---|---|---|---|---|
| DE | 4416479 | A1 | 11/1995 | |
| EP | 0669298 | A1 | 8/1995 | |
| JP | 59006303 | A * | 1/1984 | ......... C04B 41/0036 |
| JP | 2012206137 | A * | 10/2012 | |
| WO | 2011084531 | A9 | 7/2011 | |
| WO | 2013156236 | A1 | 10/2013 | |

OTHER PUBLICATIONS

Machine Translation of JP 59-6303 (Year: 1984).*
Machine Translation of JP 2012206137 (Year: 2012).*
Defintion of Proportion, Merriam-Webster, https://www.merriam-webster.com/dictionary/proportion (Year: 2019).*
Zerodur Expansion Glass Ceramic, Schott AG, https://www.schott.eom/d/advanced_optics/f7ae3c11-0226-4808-90c7-59d6c8816daf/1.3/schott_zerodur_katalog_july_2011_en.pdf (Year: 2011).*
English language abstract for DE 4119254 A1 (1992).
English language abstract for DE 4119878 A1 (1992).
P. Rudolph, "Micro-Ramanspectroscopy with Siliziumcarbid" in Dissertation "Physical Chemistry of lasermaterial-interaction with Ba-Al-Borosilikatglass, AlN, Sic, SiC-TiC-TiB2" (Berlin 2001), pp. 75-78.
Search Report from corresponding GB16094823 dated Oct. 31, 2016.
Meijer, "Laser beam machining (LBM), state of the art and new opportunities", Journal of Materials Processing Technology 149, pp. 2-17 (2004).
Temmler et al., "Design Surfaces by Laser Remelting", Physics Procedia 12(A), Lasers in Manufacturing 2011—Proceedings of the Sixth International WLT Conference on Lasers in Manufacturing, pp. 419-430 (2011).
Yeo et al., "Surface Roughness Changes in Al2O3 Induced by Nd:YAG Laser Irradiation", Journal of the Korean Physical Society 59(2), pp. 666-669 (2011).
English language abstract of EP 0686612 A1 (1995).
Bonse, J.O. (2001). Chapter 7, Summary and Outlook. In "Material processing of semi-conductors and nitride ceramics with ultrashort laser pulses", Technical University, Berlin, Germany, pp. 122-125.

\* cited by examiner

METHOD OF MANUFACTURING A HOLDING PLATE, IN PARTICULAR FOR A CLAMP FOR HOLDING WAFERS

BACKGROUND OF THE INVENTION

The invention concerns a method of manufacturing a holding plate which is provided for a holding apparatus for holding a component by electrostatic forces or vacuum, in particular a method of manufacturing a holding plate which is adapted for holding a semiconductor component, such as for example a wafer, with electrostatic forces or by means of vacuum, and which has a structured surface with protrusions, e.g. protruding burls, formed by material removal. The invention furthermore concerns a method of manufacturing a holding apparatus which is provided with the holding plate. The invention furthermore concerns a holding plate of a ceramic material with a structured surface with protrusions, which is configured for holding a component, and a holding apparatus with such a holding plate, in particular an electrostatic clamp or a vacuum clamp. Applications of the invention lie e.g. in the manufacturing of tools, machines or wafers for the semiconductor industry.

It is generally known to produce integrated circuits (semiconductor chips) by a lithographic processing of semiconductor wafers which are held during or between individual process steps with a holding apparatus (clamp) by electrostatic forces (electrostatic clamp) or by means of vacuum (vacuum clamp). Further uses of holding apparatuses lie in inspection or measurement processes in which e.g. the planarity of a wafer is detected.

The holding apparatus comprises one or two holding plates with exposed surfaces for receiving semiconductor wafers, and electrode devices, cooling devices and where applicable further electrical, mechanical or pneumatic components. As integration density grows, extremely high requirements are imposed for the planarity of the semiconductor wafers, for example in exposure steps, which must be guaranteed by the mechanical stability and planarity of the surface(s) of the holding plate(s).

Since semiconductor wafers can be disruptively deformed simply by dust particles on the surface, it has proved advantageous to provide the holding plate with a plurality of protrusions, the free faces (end faces) of which span a flat carrier surface. The protrusions comprise e.g. so-called burls. The burls offer the advantage of minimizing the contact area between the holding plate and the semiconductor wafer, and eventually occurring dust particles can be collected in the gaps between the burls. Furthermore, it has proved advantageous in practice to manufacture the holding plate from a ceramic material, since ceramic materials are available with particularly high mechanical stability and strength.

In the manufacturing of a conventional holding apparatus, firstly the holding plate is made from the ceramic material with a free flat surface. Then the burls are formed by material removal from the ceramic material. Various removal methods are known for this, such as for example material removal methods using a CNC milling machine, or removal by means of sink erosion.

The conventional methods may have the following disadvantages, in particular on manufacturing of burls with small diameters (e.g. less than 500 μm). Machining CNC processing may result in undesirable flaking at edges of the protrusions or recesses, which can lead to a reduced abrasion resistance and the occurrence of microscopically small ceramic particles. Holding plates machined by sink erosion also have a tendency towards the undesirable creation of ceramic particles. Furthermore, damage can occur to the ceramic material on sink erosion. Observations in practice show an increased fracture susceptibility of the burls as the burl diameter decreases. The fracture susceptibility is particularly critical since, actually in a holding plate with several thousand burls, the loss of just a few burls can lead to a malfunction of the holding apparatus. In many practical applications, even a disappearing error rate is required.

A further, generally known method for structuring solid body surfaces is based on material removal by laser ablation. Under the effect of a focused laser beam, the solid body is vaporized locally to create a recess in the solid body surface. Laser ablation was initially proposed for metals and has also recently been used in machining ceramic materials (see for example DE 44 16 479 A1; J. Meijer in "Journal of Materials Processing Technology", Vol. 149, 2004, p. 2-17; S. Yeo et al. in "Journal of the Korean Physical Society", Vol. 59, 2011, p. 666-669; and A. Temmler et al. in "Physics Procedia", Vol. 12, 2011, p. 419-430).

Laser ablation of ceramic material has previously been restricted mainly to surface processing of micro-mechanical components, and in particular for creating local depressions such as for example holes or trenches in an otherwise closed surface. It is known from practice that attempts to produce burls on holding plates of ceramic material by means of laser ablation have delivered unsatisfactory results only. It has for example been found that the burls can have such a high fracture susceptibility that on normal use of the holding apparatus, they break simply under the effect of the clamping force on holding of a component.

The objective of the invention is to provide an improved method of manufacturing of a holding plate for electrostatic holding or vacuum holding of a component, with which the disadvantages of conventional methods are avoided. The objective of the invention lies in particular in producing a holding plate so that protrusions can be formed which have an increased break strength both during manufacturing of the holding plate and on use of the holding apparatus, and that protrusions can be formed with reduced lateral dimensions e.g. burls with reduced diameter, and/or that the holding plate can be manufactured with a reduced error rate. The objective of the invention is furthermore to provide an improved holding plate with projecting protrusions for electrostatic holding or vacuum holding of a component, with which the disadvantages of conventional holding plates are avoided. The holding plate is to be distinguished in particular by an increased break strength of the protrusions, and increased abrasion resistance and/or a reduced tendency towards the formation of ceramic particles.

These objectives are achieved by methods, a holding plate and a holding apparatus of the invention.

DESCRIPTION OF THE INVENTION

According to a first general aspect of the invention, a method is provided of manufacturing a holding plate from a ceramic material which is adapted for a holding apparatus for holding a component by means of electrostatic forces or vacuum. The ceramic material is composed of several (two or more) chemical elements. The chemical elements form one or several (two or more) phases of the ceramic material. Each phase comprises a region of uniform chemical composition consisting of a single chemical element or a single chemical compound with a plurality of chemical elements. On at least one surface of the holding plate, a plurality of raised protrusions is formed by material removal of the ceramic material. The surface of each protrusion comprises an end face (surface at the free end of the protrusion with a surface normal perpendicular to the extension of the holding plate) and a lateral surface (remaining surface of the protrusion with the exception of the end face, including the edge bordering the end face, lateral side face and base face). The end faces of the protrusions span a plane carrier surface for the component to be held.

According to the invention, the material is removed by laser ablation. The laser ablation comprises removal of the ceramic material from the surface of the holding plate by pulsed laser irradiation. The laser irradiation takes place locally selectively, according to a geometric irradiation pattern, such that the ceramic material of the protrusions to be formed is excluded from the laser ablation.

According to the invention, furthermore—preferably after material removal—a surface modification (surface machining) of the holding plate takes place by means of the laser irradiation. Irradiation parameters of the laser irradiation are set such that one of the phases of the ceramic material is enriched on a surface of the protrusions. The surface modification comprises a pulsed laser irradiation with irradiation parameters which are modified in comparison with the material removal. The enrichment takes place such that the stoichiometric ratio of the chemical elements on the surface, in comparison with the volume material, is shifted towards at least one of the chemical elements. If the ceramic material comprises one single phase with several chemical elements, the enrichment comprises the formation of a surface layer which, by deviation from the volume material, has a higher proportion of at least one of the chemical elements. If the ceramic material comprises several phases each with one or several chemical elements, the enrichment comprises the formation of a surface layer which, by deviation from the volume material, has a higher proportion of at least one of the phases. Advantageously, the enrichment of the at least one chemical element of the ceramic material achieves a smoothing and mechanical stabilization of the surface of the ceramic material, in particular the protrusions. Suitable irradiation parameters for the surface modification, in particular the pulse duration, repetition rate and/or wavelength of the laser irradiation, are e.g. determined by reference tables, preliminary experiments or thermodynamic simulations.

According to a second general aspect of the invention, a method is proposed of manufacturing of a holding apparatus which is configured for holding a component by electrostatic forces or by vacuum, wherein at least one holding plate of the holding apparatus is produced with the method according to the first general aspect of the invention. Furthermore, the at least one holding plate is connected to at least one of an electrode device, a cooling device, a vacuum device and further electrical components, mechanical components and pneumatic components.

According to a third general aspect of the invention, a holding plate is provided which is made from a ceramic material with several chemical elements and has a plurality of protrusions on a surface. The holding plate is configured for a holding apparatus for holding a component by electrostatic forces or vacuum. According to the invention, on the surface of the holding plate, at least one of the chemical elements of the ceramic material is enriched in comparison with the distribution of the chemical elements in the volume of the ceramic material. Preferably, the holding plate is produced with a method according to the first general aspect of the invention.

According to a fourth general aspect of the invention, a holding apparatus is provided for holding a component by electrostatic forces or by vacuum, which has at least one holding plate according to the third general aspect of the invention. The holding apparatus is an electrostatic holding apparatus or a vacuum holding apparatus for holding components, in particular semiconductor wafers.

The invention is based on the following considerations of the inventors. It has been found that the fracture susceptibility of the burls on conventionally produced holding plates is caused by a porous surface structure, comprising for example pores, cracks and scars in the ceramic material. For example, on sink erosion of SiSiC (Si-infiltrated SiC) with the phases Si and SiC, it was found that a porous surface is formed. The formation of the undesirable ceramic particles on the porous surface is promoted. By means of scanning electron microscopy (SEM), it was found that the surface of ceramic material machined by sink erosion has irregular machining structures with characteristic sizes of at least 10 $\mu m$.

In contrast, it was found that material removal on the surface of the holding plate by means of laser ablation, and the enrichment of at least one of the chemical elements of the ceramic material, gives a smooth non-porous surface. SEM studies showed that the laser ablation and surface modification according to the invention provide the surface of the ceramic material with machining structures with characteristic sizes in the lateral or depth direction of less than 5 $\mu m$, in particular less than 2 $\mu m$, such as for example 1 $\mu m$ or less.

It was furthermore found that the surface modification causes a phase conversion of the ceramic material on its surface. The phase conversion may comprise a melting of the surface with subsequent solidification, a correction of surface defects (filling of remaining pores) and/or removal of residual microstructures. Furthermore, the phase enrichment can take place by thermal decomposition of a chemical compound, wherein, with the irradiation parameters selected according to the invention for the surface modification according to the phase diagram of the ceramic material, the decomposition products are present in different aggregate states and one of the decomposition components is deposited on or embedded in the microstructure close to the surface, while the other decomposition component remains as solid crust which is easy to clean away, or is vaporized or volatilized into a gaseous compound. As a result, at least one of the chemical elements, in particular at least one of the phases of the ceramic material on the surface of the protrusions, is enriched, i.e. the chemical elements and, for a multiphase ceramic material, the phases of the ceramic material are arranged on the surface of the protrusions with a stoichiometric ratio being different from the volume properties of the ceramic material. The stoichiometric ratio of the phases—such as for example, in a two-phase material such as e.g. SiSiC, the phases Si and SiC—on the surface (stoichiometric surface ratio) is shifted in favor of one phase, e.g. Si, compared with the stoichiometric ratio of the phases in the ceramic material (stoichiometric volume ratio).

Also, in a monophase material, such as e.g. SiC, a surface enrichment of one of the elements such as e.g. Si can take place in that the elements Si and C are thermally decomposed, wherein as a result the structure close to the surface is enriched with Si, leaving C as the crust which is easy to clean away or extracted as a gaseous compound (e.g. $CO_2$). The enrichment of a metal or semiconductor phase of the ceramic material on the burl surface has proved particularly advantageous for achieving a smooth burl surface.

According to a preferred embodiment of the invention, for the surface modification of the holding plate, the irradiation parameters of the laser irradiation are set such that a gloss is formed on the surface of the holding plate by the enriched phase. In other words, the surface of the holding plate is at least partly mirror-reflective. Advantageously, a holding plate with a glossy surface has advantages with regard to the mechanical stability of the protrusions and the cleaning of the holding plate.

According to a particularly preferred embodiment of the invention, the laser irradiation for the surface modification of the holding plate takes place such that the surface layer with the at least one enriched chemical element is formed exclusively in precisely defined surface regions, preferably on the lateral surfaces of the protrusions. Restricting the surface modification to the side faces of the protrusions offers advantages for the processing speed, without leading to a deterioration in the stability of the protrusions. Alternatively or additionally, a modification of the surface of the holding plate may be provided between the protrusions, i.e. on the bottom surface between the protrusions. This may be advantageous for reducing sources of contamination or for the visual appearance of the holding plate.

According to a preferred embodiment of the invention, the laser ablation comprises several irradiation steps. In each irradiation step, a layer of the ceramic material is removed under the effect of the laser irradiation. The laser irradiation takes place with a predefined irradiation pattern according to the desired form and position of the protrusions. Removal of the material by layers has the advantage that the irradiation parameters of the laser irradiation can be optimized for a gentle material removal, and the desired depth of the structuring (height of protrusions) may be achieved by repeating the irradiation steps.

Each irradiation step may be carried out with the same irradiation pattern so that, as a result, the external form of the protrusions is determined by the boundaries of the irradiation region and the form of the radiation field in the focus of the laser irradiation. According to an alternative and preferred variant of the invention, the irradiation steps may be executed with different irradiation patterns. Preferably, the irradiation pattern in each further irradiation step, i.e. on the removal of each further layer of the ceramic material, is changed such that the protrusions are formed with a predefined lateral contour (shape of the surfaces in the axial direction of the protrusions). Preferably, the irradiation pattern is changed such that the edges of the lateral surface of the protrusions towards the end faces and/or the base faces of the protrusions are rounded. Advantageously, the rounded contour—in particular in the base region of the burls—allows an improved dissipation of mechanical stresses so that the break strength of the burls is increased.

According to a further preferred embodiment of the invention, the laser irradiation is directed serially in points or lines onto the surface of the holding plate. The laser ablation and surface modification take place such that the surface of the holding plate is scanned (sampled) with the focus of the laser irradiation corresponding to the desired irradiation pattern. The focus of the laser irradiation is guided in points or lines over the surface of the ceramic material so that the material is two-dimensionally removed with the exception of the protrusions. On conventional use of laser ablation, a depression is made in a solid body surface which is delimited laterally by solid body material. In contrast to this conventional material removal limited to points or lines, with the method according to the invention the material removal preferably takes place across the surface, wherein the protrusions remain as freestanding structures. Advantageously, the protrusions are not adversely affected by the laser ablation and, because of the gentle material machining, are formed with a higher break strength than in conventional methods. Particularly preferably, the material is two-dimensionally removed—with the exception of the protrusions—with an aspect ratio such that the total area of the end faces comprises less than 10%, in particular less than 5% or even less than 3% of the total surface area of the holding plate which is exposed to the laser irradiation.

Particular advantages for the precise and reproducible setting of the irradiation pattern on each irradiation step result if, according to a further preferred embodiment of the invention, the laser irradiation is generated with a laser source which is moved relative to the holding plate with a carrier head which can be moved along at least three, particularly preferably along five axes. Preferably, the laser source comprises a pulse laser which is attached directly to the carrier head and is set with this relative to the holding plate. Alternatively, the laser source comprises a stationarily positioned pulse laser with a light guide, the output end of which with a focusing optic is attached to the carrier head and can be set with this relative to the holding plate. According to a further alternative, the laser irradiation may be set relative to the holding plate with pivotable mirrors.

If the maximum working area of the carrier head is smaller than the lateral extension of the holding plate, the material removal preferably takes place successively in a plurality of adjacent surface regions of the holding plate. To irradiate each surface region, the carrier head and the holding plate are moved relative to each other such that the respective surface region is covered by the working area of the carrier head. Particularly preferably, the laser irradiation is controlled such that patterns of the arrangement of protrusions continue uninterruptedly over adjacent surface regions. In other words, the irradiation pattern is selected in each surface region such that the irradiation pattern in a first surface region is continued uninterruptedly in the adjacent surface region. The uninterrupted continuation of the irradiation pattern means that the position and extent of the individual surface regions are no longer detectable visually in the global arrangement of the protrusions.

Preferably, the carrier head and the holding plate are moved relative to each other between the irradiations of the surface regions, in particular during the surface modification, such that the surface regions overlap. Advantageously, this further improves the homogeneity of the visually perceptible appearance of the holding plate.

Advantageously, the application of the invention is not restricted to certain ceramic materials. Rather, the holding plate may be made of a ceramic material which is selected as a function of the concrete application of the holding apparatus. Preferred ceramic materials include SiC, SiSiC, $Si_3N_4$, CrN, WC, $B_4C$, AlN or $Al_2O_3$. If the ceramic material comprises $Si_3N_4$, SiC or SiSiC, for the surface modification according to the invention, the irradiation parameters of the laser irradiation are set such that the surfaces of the protrusions have a higher Si proportion than the volume material. For the other examples of ceramic materials—in each case correspondingly—preferably the Cr, W, B or Al phase on the surface of the protrusions is enriched.

A further advantage of the application of laser ablation according to the invention in the surface structuring of the holding plate for a holding apparatus, lies in the substantially greater variability in the selection of positions, form and size of the protrusions. The protrusions comprise e.g. columnar protrusions (so-called burls) or linear protrusions such as webs or ribs. All protrusions of a holding plate may have the same size and form. Alternatively, the protrusions may be formed with variable dimensions and/or forms along the surface of the holding plate. For example, the burls may be formed with a diameter which increases from the middle of the holding plate towards its rim. Advantageously, in this way the burls may have an increased break strength towards the edge and better absorb the eventually greater forces occurring at the rim. Alternatively or additionally, the density of the burls may vary along the surface of the holding plate. For example, the density of the burls may increase from the center of the holding plate towards its rim.

For practical applications of the holding plate according to the invention, it has proved advantageous if the burls are formed with at least one of the following features. The burls may have a cylindrical form or a truncated pyramid form or a frustoconical form. Preferably, the end faces of the burls have a diameter of less than 500 µm, in particular less than 300 µm, particularly preferably less than 200 µm. Furthermore, the burls preferably have a height (axial direction perpendicular to the lateral extension of the holding plate) which is greater than 25 µm, particularly preferably greater than 150 µm. Particular advantages for the dissipation of mechanical stresses result if the burls have a cylindrical shape with a base portion having a rounded contour.

A further advantage of the invention lies in the variability in the selection of irradiation parameters of the laser irradiation. Preferably, the laser irradiation comprises laser pulses with a pulse duration in the range from 2 ns to 300 ns. Furthermore, the repetition rate of the laser pulses is preferably selected in the range from 30 kHz to 200 kHz. The pulse duration and the repetition rate determine the energy input into the ceramic material. Advantageously, the pulse duration and/or the repetition rate of the laser pulses may vary during the material removal, in particular in the course of the successive irradiation steps. For example, the material removal may be maximized in a first phase of the laser ablation, and the formation of a smooth surface of the burls may be optimized in a second phase of the laser ablation.

The wavelength of the laser irradiation is preferably selected as a function of the absorption of the ceramic material. If the holding plate is made from SiSiC, the laser irradiation preferably has a wavelength at which the absorptions of Si and SiC overlap to a maximum. In this case, the wavelength is preferably selected in the range from 500 nm to 1500 nm, particularly preferably in the range from 900 nm to 1100 nm.

According to a further advantageous variant of the invention, the laser ablation may be combined with another process of material removal, in particular a mechanically acting machining or electro-erosion machining. According to a variant, after the laser ablation and surface modification of the protrusions, a volume material between the protrusions may also be removed by means of a mechanically acting tool and/or by means of sink erosion. Advantageously, this can increase the speed of surface structuring of the holding plate.

BRIEF DESCRIPTION OF THE DRAWINGS

Further details of the invention are described below with reference to the enclosed drawings. The drawings show in.

Features of preferred embodiments of the invention are described below, in particular with reference to the manufacturing of a holding plate with protrusions. Further method steps of manufacturing of the holding apparatus, such as for example the combination with further mechanical, electrical and/or pneumatic components, are not explained since these are known from the manufacturing of conventional holding apparatuses (clamps).

Preferentially, reference is made below to the formation of burls with a circular round cross-section and a cylindrical or frustoconical form (FIGS. 1 to 6). The application of the invention is not restricted to the formation of these particular forms, but is also suitable for providing other forms and structures by the selection of a suitable irradiation pattern of the laser ablation and/or by combination with material-removal methods (FIG. 7). For example, burls with a cross-sectional form in the shape of an ellipse or a rectangle with rounded corners, webs or walls with straight or curved wall surfaces, can be formed with the use of laser ablation according to the invention. Although the manufacturing of protrusions is described only on one surface of the holding plate, alternatively the protrusions may be formed on both surfaces of the holding plate.

Figure 1:
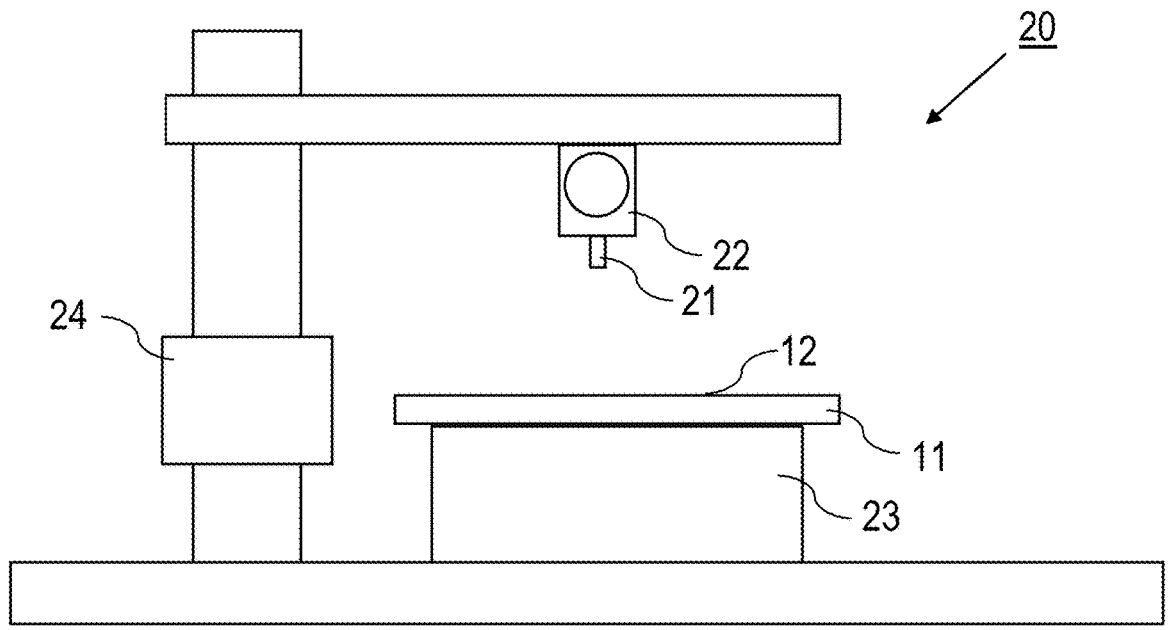
FIGS. 1 and 2: schematic illustrations of features of the method according to the invention.

FIG. 1 illustrates in a schematic side view a laser ablation machine 20 which is configured for surface structuring of a holding plate 11 of an electrostatic holding apparatus by means of laser ablation. The laser ablation machine 20 comprises a laser source 21, a five-axis carrier head 22 and a carrier platform 23 for receiving the holding plate 11. An operating and control unit 24 is provided for inputting control data and for controlling the laser source 21 and the carrier head 22. The carrier head 22 can be moved with five degrees of freedom which comprise two translational degrees of freedom in a plane perpendicular to the drawing plane, and three rotational degrees of freedom corresponding to the three spatial directions. Further details of the laser ablation machine 20, such as for example a protective housing or auxiliary tools, are not shown in FIG. 1.

The laser source 21 comprises for example a pulsed Yb fiber laser with an output power of 20 W, 30 W or 50 W. The laser source 21 is configured to generate laser pulses with a mean wavelength of 1060 nm, a pulse duration in the range from 2 ns to 200 ns, and a repetition frequency in the range of 30 kHz and 200 kHz.

The holding plate 11 is for example a circular round disc made from SiSiC using known sintering methods, and has a plane surface 12. The diameter of the holding plate 11 lies for example in the range from 30 cm to 45 cm, and the thickness lies for example in the range from 1.5 mm to 50 mm. If the holding plate 11 is provided to hold a component by means of vacuum, it comprises holes for generating a reduced pressure under a component held on the protrusions, relative to the external atmospheric pressure. The blank of the holding plate 11 with the unmachined surface 12 is fixed onto the carrier platform 23.

The desired process properties for surface structuring of the holding plate 11 are entered on the input and control unit 24. The process properties comprise the arrangement and shape of burls to be formed on the surface 12 by laser ablation, irradiation parameters for operating the laser source 21, and scanner parameters for operating the carrier head 22. The irradiation parameters comprise the choice of pulse duration and repetition rate for the individual irradiation steps. The scanner parameters comprise a scanner speed (speed of the carrier head 22 along the five axes) and—if the maximum working area of the carrier head is smaller than the extension of the surface 12 of the holding plate 11—the definition of surface regions to be successively subjected to laser ablation.

On the basis of the desired arrangement and shape of the burls, at least one irradiation pattern for controlling the carrier head 22 is produced with the input and control unit 24. One single irradiation pattern is sufficient if the desired height of the burls can be achieved by material removal in a single irradiation step, i.e. by a single sweep of the focused laser beam over the surface 12. Furthermore, one single irradiation pattern is sufficient if several irradiation steps are provided each with the same irradiation pattern, for example for producing cylindrical burls. In the case of laser ablation with several irradiation steps, a plurality of irradiation patterns may be used in order to produce the burls with a predefined lateral contour, for example in the form of a truncated cone or cylinder with a rounded base region.

Figure 2:
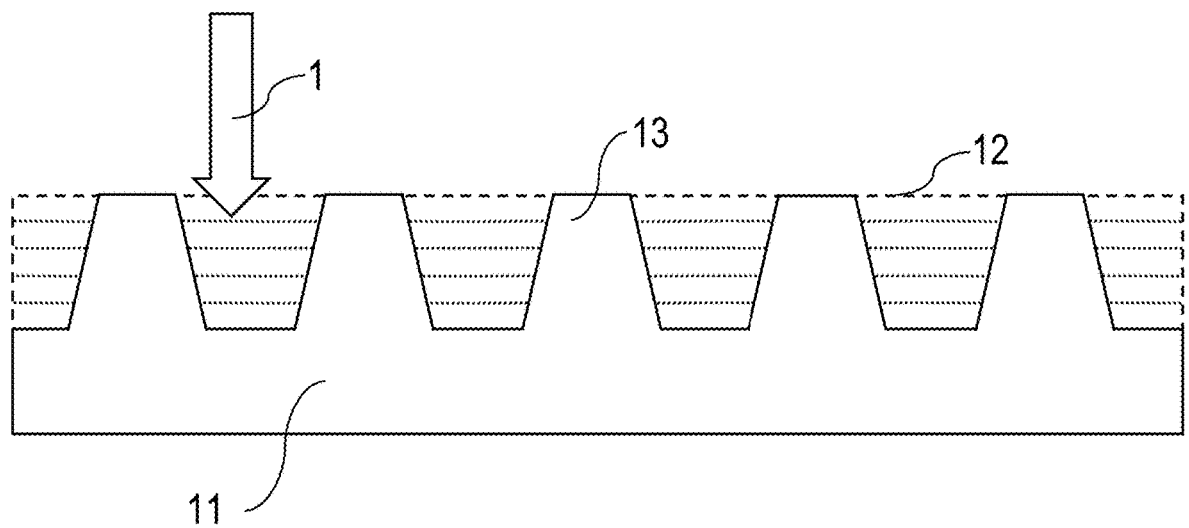

The formation of burls 13 on the holding plate 11 in several irradiation steps is illustrated schematically in FIG. 2. To form the burls 13 with a height in the range from 50 µm to 200 µm, at least five irradiation steps are provided followed by the surface modification of the burls 13 (finishing) according to the invention. For each of the irradiation steps, the laser irradiation 1 removes a layer with a thickness in the range for example from 10 µm to 20 µm (for example, four intermediate states are depicted with dotted lines). For this, in the machining of SiSiC for example, a scanner speed in the range from 700 mm/s to 900 mm/s, a pulse duration of 200 ns and a repetition rate of 30 kHz are set. The burls 13 are formed with a diameter in the range of e.g. 50 µm to 500 µm.

The final surface modification takes place with the same scanner speed and repetition rate of the laser pulses as the material removal, and with a shorter pulse duration, for example 30 ns. The surface modification comprises a final irradiation step in which a change is obtained in the stoichiometric ratios of Si and C on the surface of the burls 13, in particular on their lateral surfaces 13.2, 13.3, 13.4 (see FIG. 5). Optionally, a slight material removal may occur. The material removal for surface modification may e.g. amount to ⅕ to ½ of the material removal achieved in the preceding irradiation steps, e.g. 4 µm to 5 µm. The stoichiometric ratios are for example changed such that the burl surfaces primarily comprise Si, so that the burls shine metallically.

The optimal irradiation parameters and scanner parameters may be determined, depending on the ceramic material to be machined, using reference tables or by preliminary experiments. In the case of a preliminary experiment, a reference plate made from the same ceramic material as the holding plate 11 to be machined is subjected to laser ablation, which is carried out in several reference regions with various irradiation and scanner parameters. A microscopic examination of the reference regions with visual assessment of the surface properties achieved gives the desired irradiation and scanner parameters of manufacturing of the burls 13 and for their surface modification.

After the surface modification of the burls 13, the holding plate 11 with the structured surface may be subjected to post-processing, for example a cleaning of the structured surface, deposition of an electrode layer and/or deposition of a dielectric layer. Then the complete holding apparatus is assembled in that the holding plate 11 is connected to further mechanical, electrical and/or pneumatic components.

Figure 3:
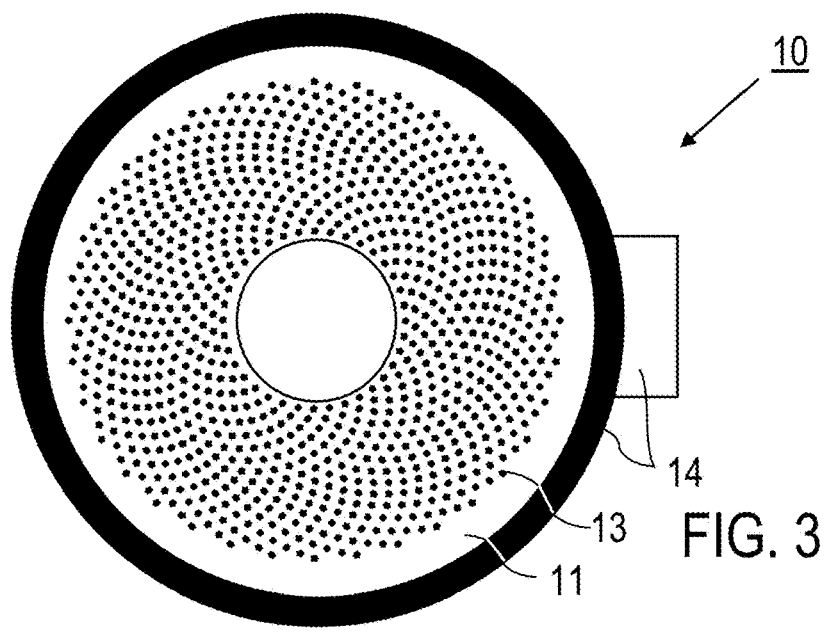
FIG. 3: a schematic top view of the holding apparatus according to an embodiment of the invention.

FIG. 3 illustrates schematically a top view of a holding apparatus 10 according to the invention. The holding apparatus 10, which for example forms a clamp for semiconductor wafers, comprises the exposed holding plate 11 with the burls 13 and further components 14 illustrated schematically. The holding apparatus 10, apart from the holding plate 11, is constructed as a conventional holding apparatus. The burls 13 are arranged according to the selected irradiation pattern with a predefined geometric distribution. For example 10,000 to 40,000 burls 13 are provided on the holding plate 11, each with a diameter of 50 µm to 500 µm. It is a particular advantage of the invention that the laser ablation takes place so gently and the burls 13 are formed with such a break strength that even when post-processing is carried out, no burls are broken away from the finished holding plate 11.

Figure 4:
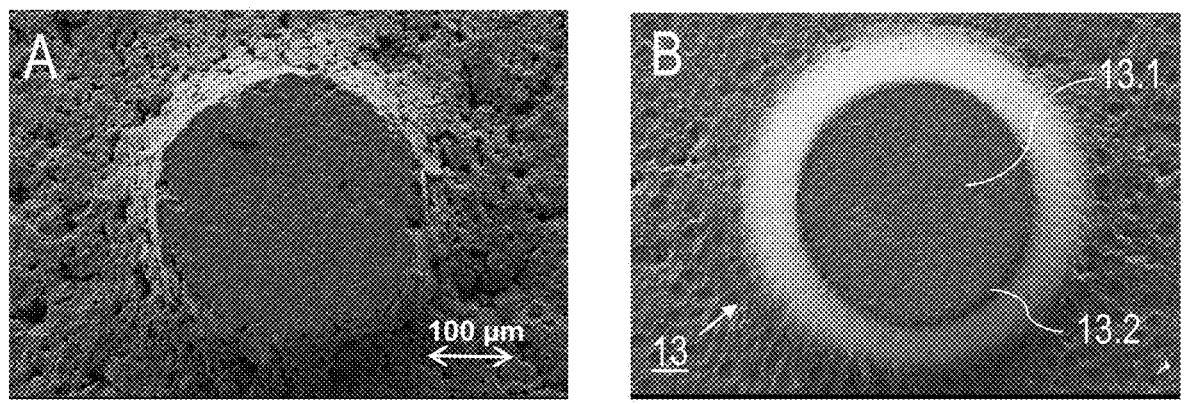
FIG. 4: electron-microscopic images of burls produced with a conventional process and with the method according to the invention.

FIG. 4 illustrates a further important advantage of the invention. FIGS. 4A and 4B show respectively scanning electron microscopic top views of burls which were produced by conventional sink erosion (FIG. 4A) and by the laser ablation used according to the invention with surface modification (FIG. 4B). It is clear that the burls 13 produced according to the invention have a smooth surface which is free from pores and cracks, in particular in the region of the edge 13.2. This substantially improved surface quality of the burls produced according to the invention gives the advantages of an increased mechanical stability due to lesser surface damage (micro-fissures), a reduced particle emission by abrasion, and in increased homogeneity of the burl diameter and the circular form of the burl.

X-ray examinations of the burls shown in FIG. 4 give an Si proportion of around 15 vol. % for the volume material. A reduced Si proportion of down to 10 vol. % was found on the surface of the burls produced by conventional sink erosion (FIG. 4A), whereas in the burl produced by laser ablation (4B), an increase was found in the region of 25 vol. % to 45 vol. %. This increase in the Si proportion due to the method according to the invention, in particular due to the surface modification with reduced material removal, offers particular advantages for a reduced particle emission when the holding apparatus is used for holding semiconductor wafers. Due to the surface machining, the burl surface down to a depth of e.g. 30 µm has a greater ductility than the volume material. The increased ductility contributes to improving the break strength, since under mechanical loading the burl surface has a greater tendency to plastic deformation than the volume material. The plastic deformation allows the absorption of energy, which reduces the stress on the burl.

Figure 5:
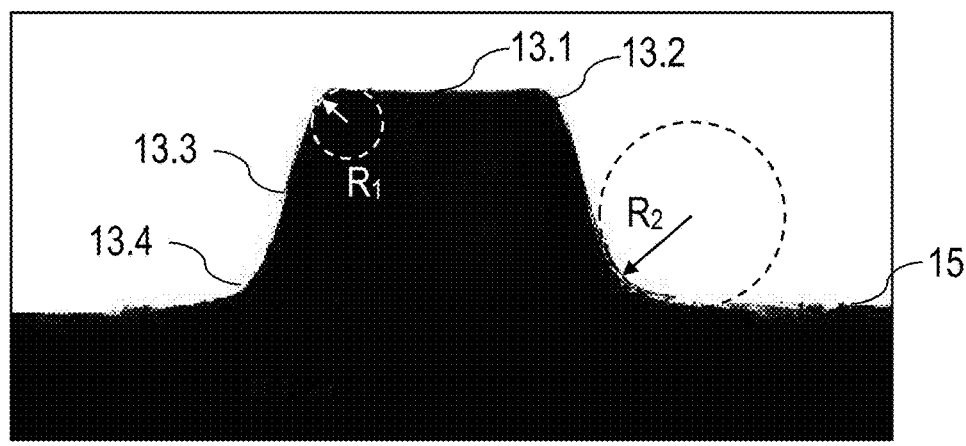
FIG. 5: a schematic sectional view of a burl with rounded edges.

FIG. 5 shows a scanning electron microscopic sectional view of a burl 13 according to a further embodiment of the invention. The burl 13 has the form of a truncated cone with a flat end face 13.1, a rounded edge 13.2, a frustoconical side face 13.3 and a rounded base face 13.4 between the side face 13.3 and the bottom 15 between adjacent burls. Due to the use of laser ablation according to the invention, the radii of curvature $R_1$ and $R_2$ (with $R_2 > R_1$) can advantageously be set such that mechanical stresses on the edge 13.2 of the end face 13.1 or the base face 13.4 are dissipated. The sloping form of the frustoconical lateral surface is achieved in that the irradiation pattern is varied slightly on each irradiation step (stepped reduction in irradiation region between the burls 13 with increasing material removal). By deviation from FIG. 5, a burl 13 may be formed with a cylindrical lateral surface, wherein the laser source 21 with a carrier head 22 movable in five axes is operated with an irradiation direction sloping towards the burl 13.

Experimental investigation of the roughness of the burl surface at various irradiation and scanner parameters showed a minimum roughness from a repetition rate of around 100 kHz, pulse durations of 30 ns and 100 ns, and various scanning speeds.

Figure 6:
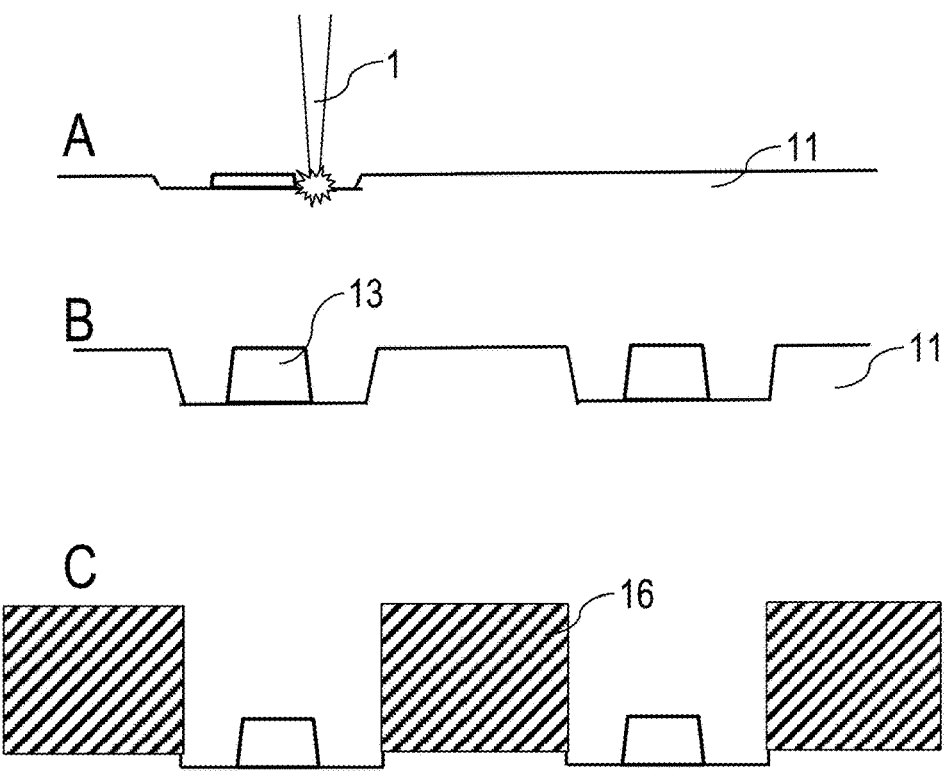
FIGS. 6 to 7: illustrations of the combination of laser ablation with an electro-erosion or mechanically acting tools.
Figure 7:
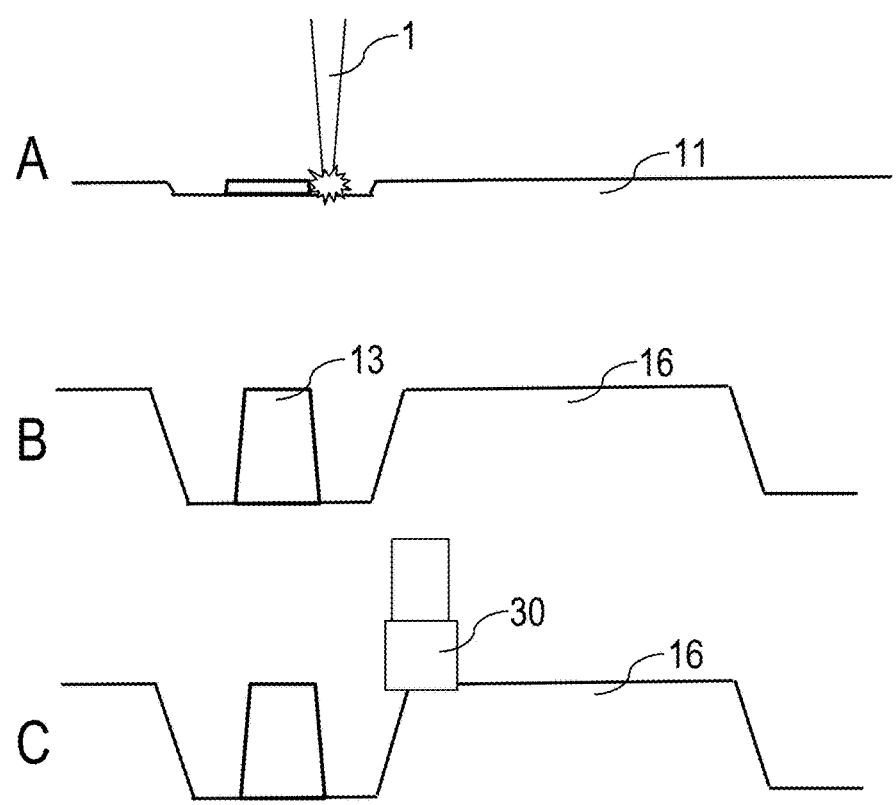

FIGS. 6 and 7 illustrate schematically different applications of the combination of laser ablation with other methods of material removal. According to FIG. 6, laser ablation is used to form the burls 13 in the surface 12 of the holding plate 11 (FIGS. 6A, B). The laser irradiation 1 is controlled such that the ceramic material is removed only in the immediate vicinity of the burls 13 and subjected to the surface modification according to the invention. The volume material 16 remaining in the gaps between the burls 13 (shown in hatching in FIG. 6C) is then removed by sink erosion with increased removal speed. Since the sink erosion is restricted to the regions between the burls 13, the disadvantages of conventional usage of sink erosion for the burls 13 are avoided. Furthermore, the removal speed is substantially increased.

Alternatively, the laser ablation may be combined with a machining removal process as shown in FIG. 7. This is particularly advantageous for the structuring of ceramic materials which are poorly suited to erosion processing, such as for example SiN, AlN or $Al_2O_3$. In a first removal step, by laser ablation by means of the laser irradiation 1, the burls 13 are exposed and subjected to surface modification (FIGS. 7A, 7B), wherein said advantages in relation to the surface, break strength and shape of the burls 13 are exploited. Then using a material-removal tool, such as for example an ultrasonic grinding tool 30, the volume material 16 between the burls 13 is removed (FIG. 7C).

The features of the invention disclosed in the description above, the drawings and the claims may be important both individually and in combination or sub-combination for implementing the invention in its various embodiments.

What is claimed is:

1. A method of manufacturing of a holding plate having a ceramic material of one single phase with at least two chemical elements and being configured for a holding apparatus for holding a component by electrostatic forces or vacuum, the method comprising:
    material removal from the holding plate by laser ablation, wherein by a laser irradiation a plurality of protrusions are formed on the holding plate, end faces of which span a carrier surface for the component, and
    surface modification of the holding plate by the laser irradiation, wherein irradiation parameters of the laser irradiation are set such that at least one of the chemical elements of the ceramic material is enriched on the surface of the holding plate such that the stoichiometric ratio of the chemical elements on the surface, in comparison with the volume material, is shifted towards at least one of the chemical elements,
    the enrichment including the formation of a surface layer which includes said at least two chemical elements and, by deviation from the volume material, has a higher proportion of at least one of the chemical elements relative to remaining chemical elements of said at least two chemical elements within said surface layer.

2. The method according to claim 1, wherein a gloss is formed on the surface of the holding plate by the at least one enriched chemical element.

3. The method according to claim 1, wherein the at least one of the chemical elements is enriched exclusively on the surface of the protrusions.

4. The method according to claim 3, wherein the at least one of the chemical elements is enriched exclusively on lateral surfaces of the protrusions.

5. The method according to claim 1, wherein the material removal takes place in layers in a plurality of irradiation steps, wherein in each irradiation step, a layer of the ceramic material is removed corresponding to a predefined irradiation pattern of the laser irradiation.

6. The method according to claim 5, wherein in each irradiation step, the irradiation pattern of the laser irradiation is changed and the protrusions are formed with a predefined lateral contour.

7. The method according to claim 6, wherein in each irradiation step, the irradiation pattern of the laser irradiation is changed and the protrusions are formed with at least one of rounded edge portions and rounded base portions.

8. The method according to claim 1, wherein, except for the protrusions, the material removal takes place across the surface with an aspect ratio such that the end faces comprise less than 10% of a total surface area exposed to the laser irradiation.

9. The method according to claim 8, wherein, except for the protrusions, the material removal takes place across the surface with an aspect ratio such that the end faces comprise less than 5% of the total surface area exposed to the laser irradiation.

10. The method according to claim 1, wherein:
    the laser irradiation is generated with a laser source which is moved relative to the holding plate, the laser source in communication with a carrier head which can be moved along at least three axes,
    the laser irradiation takes place successively in a plurality of surface regions of the holding plate, an extension of each of which is less than a maximum working area of the carrier head, and
    the carrier head and the holding plate are moved relative to each other between the irradiations of the surface regions such that the surface regions overlap.

11. The method according to claim 1, wherein the ceramic material comprises SiC, $Si_2C$, $Si_3N_4$, CrN, WC, $B_4C$, AlN or $Al_2O_3$.

12. The method according to claim 11, wherein
    the ceramic material comprises $Si_3N_4$, SiC or $Si_2C$, and
    the irradiation parameters of the laser irradiation are set such that surfaces of the holding plate have a higher Si proportion than a volume material.

13. The method according to claim 1, wherein the protrusions have at least one of:
    burls having a cylindrical, truncated pyramid or frustoconical form,
    burls with an end face with a diameter of less than 300 μm,
    burls with a height of more than 25 μm,
    burls which are connected to the holding plate via a base portion which has a rounded casing contour, and
    at least one of webs and ribs.

14. The method according to claim 1, wherein the laser irradiation has at least one of:
    laser pulses with a pulse duration in a range of 2 ns to 300 ns,
    laser pulses with a repetition rate in a range of 30 kHz to 200 kHz, and
    a wavelength at which absorptions of phases of the ceramic material overlap to a maximum.

15. The method according to claim 1, wherein another process of material removal after laser ablation additionally comprises a removal of volume material between the protrusions by at least one of a mechanically acting tool and sink erosion.

16. A method of manufacturing of a holding plate having a ceramic material of a plurality of phases with at least two chemical elements and being configured for a holding apparatus for holding a component by electrostatic forces or vacuum, the method comprising:
- material removal from the holding plate by laser ablation, wherein by a laser irradiation a plurality of protrusions are formed on the holding plate, end faces of which span a carrier surface for the component, and
- surface modification of the holding plate by the laser irradiation, wherein irradiation parameters of the laser irradiation are set such that at least one of the chemical elements of the ceramic material is enriched on the surface of the holding plate such that the stoichiometric ratio of the chemical elements on the surface, in comparison with the volume material, is shifted towards at least one of the chemical elements,
- wherein the enrichment includes the formation of a surface layer which includes said plurality of phases and, by deviation from the volume material, has a higher proportion of at least one of the phases relative to remaining phases of said plurality of phases within said surface layer.

17. A method of manufacturing a holding apparatus for holding a component by electrostatic forces or vacuum, wherein at least one holding plate of the holding apparatus is produced with the method according to claim 1.

* * * * *